Oct. 8, 1968 P. SVEDBERG ET AL 3,405,332

SEMI-CONDUCTOR DEVICE WITH INCREASED REVERSE AND FORWARD BLOCKING VOLTAGES

Filed Jan. 26, 1966 3 Sheets-Sheet 1

INVENTORS
PER SVEDBERG
ERIC SPICAR
BY
Bailey, Stephens & Huettig
ATTORNEYS

INVENTORS
PER SVEDBERG
ERIC SPICAR
BY
Bailey, Stephens & Huettig
ATTORNEYS

INVENTORS
PER SVEDBERG
ERIC SPICAR
BY
Bailey, Stephens & Huettig
ATTORNEYS

United States Patent Office 3,405,332

Patented Oct. 8, 1968

3,405,332

SEMI-CONDUCTOR DEVICE WITH INCREASED REVERSE AND FORWARD BLOCKING VOLTAGES

Per Svedberg, Vallingby, and Eric Spicar, Ludvika, Sweden, assignors to Allmänna Svenska Elektriska Aktiebolaget, Vasteras, Sweden, a corporation of Sweden Filed Jan. 26, 1966, Ser. No. 523,171
Claims priority, application Sweden, Jan. 30, 1965, 1,258/65
3 Claims. (Cl. 317—235)

ABSTRACT OF THE DISCLOSURE

A controllable semi-conductor device has two connections for the load current and has three junctions between alternately p- and n-conducting layers; the base layers have low conductivity; a control electrode is connected to one of the base layers and a bias electrode to the other on which a sufficient voltage can be imposed to make both junctions adjacent such layer reverse biased; the area of contact of the bias electrode with such base layer is always outside the depletion layers formed at the adjacent junctions when the device is non-conducting.

Figure 1:
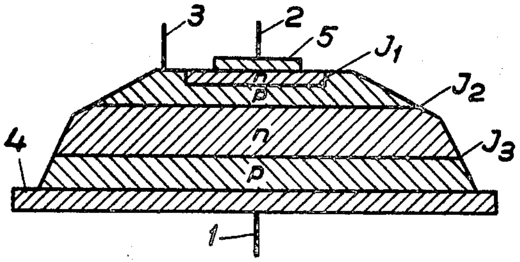

The present invention relates to a semi-conductor device comprising a semi-conductor body with at least three pn junctions between layers of alternately opposite conductivity types, at least two layers of relatively high resistivity, base layers which are adjacent to each other and are surrounded by layers of relatively low resistivity, said emitter layers, one of the two base layers being provided with a control electrode for the supply of a control current.

Such device with four layers and three pn junctions are known as thyristors. Such a device is shown in cross section in FIG. 1. The two outer layers, the emitter layers, usually have a greater concentration of doping atoms than the two intermediate layers, the base layers, and the p-conducting base layer a greater concentration of doping atoms than the n-conducting base layer. An anode lead 1 is connected to the p-conducting emitter layer, a cathode lead 2 is connected to the n-conducting emitter layer and a control electrode 3 is connected to the p-conducting base layer. When the cathode 2 is positive in relation to the anode 1 (the reverse blocking condition), the pn junctions $J_1$ and $J_3$ are reverse biased, while the junction $J_2$ is forward biased. When the anode 1 is positive in relation to the cathode 2, the pn junction $J_2$ is reverse biased, while $J_1$ and $J_3$ are forward biased. The device in this latter case is said to be in the forward blocking condition. In a known way by making the control electrode 3 more strongly positive in relation to the cathode 2 for a moment, a relatively strong current pulse will flow between these two electrodes and through its internal feed-back the semiconductor device will go over very quickly from the forward blocking condition to the conducting condition.

It is, of course, desirable that the semi-conductor device shall withstand as high voltages as possible when blocking in the forward or reverse directions. Its breakdown voltage is, however, lower than the breakdown voltage of the junction or junctions which are reverse biased. This is due to the fact that carriers are injected from adjacent forward-biased junctions which increase the current through the blocking junction or junctions.

The breakdown voltage can be increased either by increasing the breakdown voltage for the blocking junction or junctions or also by reducing the negative effects of the injected carriers. During the forward blocking interval (the anode positive in relation to the cathode) as mentioned the junction $J_2$ blocks, while $J_1$ and $J_3$ are forward biased, during the reverse blocking interval (the cathode positive) $J_1$ and $J_3$ are blocking while $J_2$ is forwardly biased. $J_2$ usually has a low breakdown voltage (or is in certain cases short circuited), so that in the latter case the blocking voltage of $J_3$ is decisive. The breakdown voltage of $J_2$ and $J_3$ can be increased by making the n base layer lying between them thicker and increasing its resistivity. This means, however, that the forward voltage drop of the semi-conductor device is increased.

According to the invention the influence of the injected carriers on the blocking junction is reduced. When the semi-conductor device blocks in the forward direction in previously known semi-conductor devices of this type holes are injected from $J_3$ towards the blocking layer $J_2$, and when the semi-conductor device blocks in the reverse direction, holes are injected from $J_2$ against $J_3$, which reduces the breakdown voltage of the device. By greatly reducing or preventing this injection, the breakdown voltage can thus be raised. According to the invention, this is carried out by providing at least that one of the base layers to which the control electrode is not connected with at least one bias contact, which is connected to a voltage source which is arranged so that at least during the time that the device is non-conducting it produces a voltage of such a size and polarity that the pn junctions lying on both sides of the layer become biased in the blocking direction.

Figure 2:
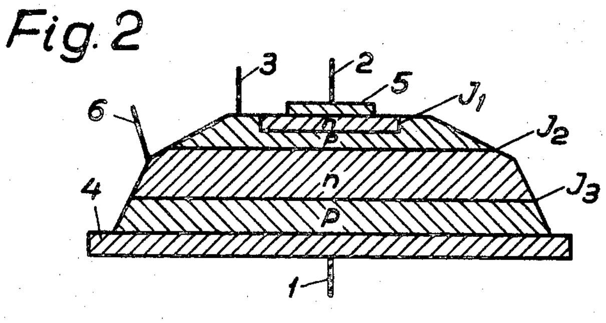
Figure 3:
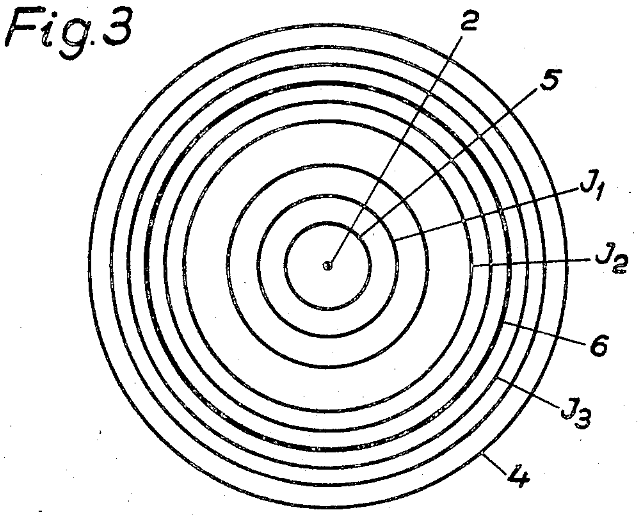
Figure 4:
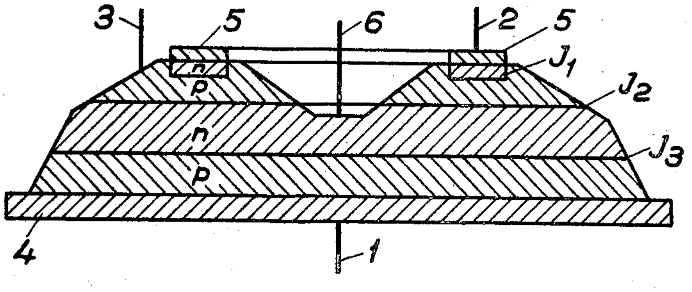
Figure 5:
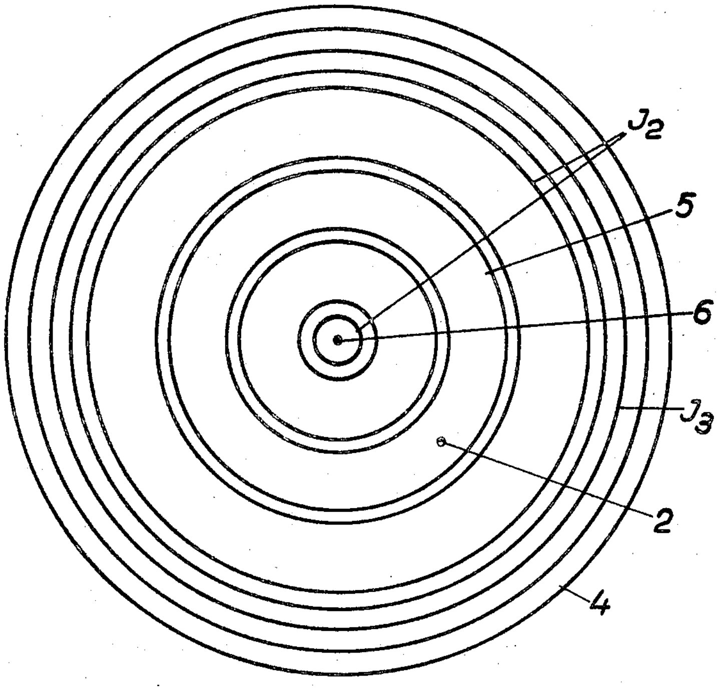
Figure 6:
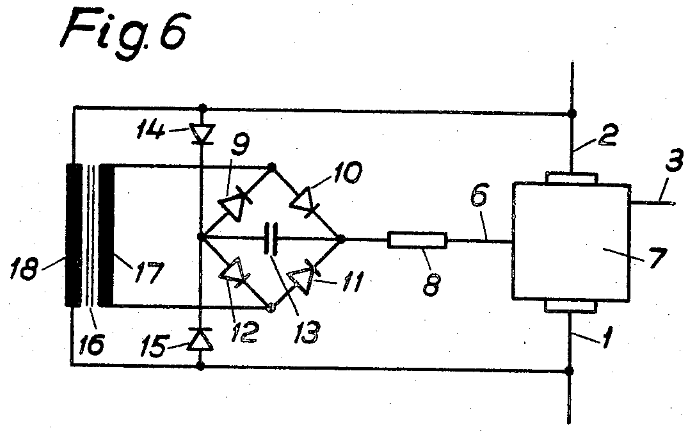
Figure 7:
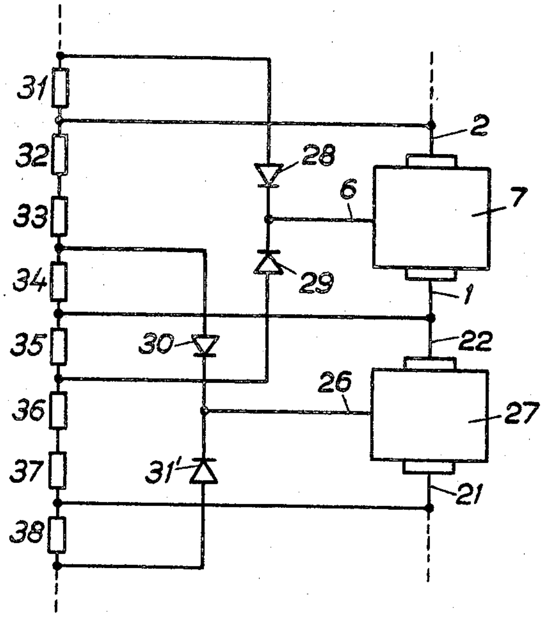

The invention will be described more fully with reference to the accompanying drawings. FIG. 1 shows a section through a previously known device of this type. FIG. 2 shows a section through a semi-conductor device according to the invention. FIG. 3 shows an embodiment of the device where the contact 6 is ring-shaped. FIG. 4 shows a cross section of an embodiment where the contact 6 is introduced into the layer through openings in the n emitter and p base layers. FIG. 5 shows the same embodiment seen at right angles to the plane of the layer. FIG. 6 shows a method of obtaining the desired bias voltage. FIG. 7 shows another method of obtaining the bias.

In FIG. 1 is shown a section through a pnpn semi-conductor device of a previously known type. The four layers are designated from the top n emitter, p base, n base, and p emitter. The junctions between the layers are designated $J_1$, $J_2$ and $J_3$ respectively. Through the contact 4 the anode lead 1 is connected to the p emitter, through the contact 5 the cathode lead 2 is connected to the n emitter and the control electrode 3 is connected to the p base. During the forward blocking interval the junction $J_2$ is blocking. Its breakdown voltage is, however, reduced by the injected hole current from $J_3$. During the reverse blocking interval, $J_3$ blocks and its breakdown voltage in the same way is reduced by the hole current injected from $J_2$.

According to the invention this reduction can be counteracted or prevented by the arrangement shown in FIG. 2. Here the n base layer has been provided with an electrode 6 which is connected to a suitable bias source. During the forward blocking interval, the electrode 6 and thereby the n base layer is given a positive bias in relation to the anode 1 for example 1–20% of the voltage applied over the semiconductor device. The junction $J_3$ then becomes biased in the reverse direction and the hole injection from $J_3$ to $J_2$ will be greatly reduced, which results in an increased breakdown voltage of the semi-conductor device. In an analogous way during the reverse blocking interval the electrode 6 is given a positive bias of similar magnitude in relation to the cathode 2, whereby the injection of holes from $J_2$ to $J_3$ is reduced and the breakdown voltage is also raised in the reverse blocking direction.

In order as far as possible to distribute the effects of the contact 6 over the whole area of the semi-conductor device, the contact is suitably made ring-shaped according to FIG. 3, which shows the semi-conductor device seen from above.

Another suitable embodiment of the connection of the contact to the layer is shown in FIGS. 4 and 5. The layers lying on the one side of the n base layer, the p base and the n emitter, are provided with openings through which the contact 6 and its source are connected to the n base layer. In the figure these openings are made as a conical hollow in the semi-conductor device, tapered towards the bottom, but other shapes are also feasible. Further, the hollow shown in the figure is placed centrally in the semi-conductor body, which is advantageous, but not essential. The n emitter layer and the contact 5 of the cathode 2 are shown to be ring-shaped in the figures, but these could also be made as discs, in which the said openings have been made.

The placing of the contact 6 in relation to the junctions $J_2$ and $J_3$ is important. As known, at each pn junction a region is formed where there is a lack of carriers, the so-called depletion layer. This layer increases in thickness when the junction is reverse biased and becomes smaller when the junction is forward biased. The contact 6 should be placed so that it lies between the depletion layer which is formed at $J_2$, when the semi-conductor device is blocking in the forward direction and the depletion layer which is formed at $J_3$ when the semi-conductor device is blocking in the reverse direction. It can also be feasible to use two electrodes, so that that electrode which lies outside the depletion layer is always connected to the bias source.

FIG. 6 shows an embodiment of the semi-conductor device which includes the bias source. The semi-conductor body 7 is shown schematically with the anode connection 1, the cathode connection 2, the control electrode 3 and the contact 6. The last mentioned contact is connected to the positive direct voltage pole of a rectifier bridge 9, 10, 11, 12 over the resistor 8. A condenser 13 is connected across the direct voltage output of the bridge. The negative direct voltage pole is connected to the connection point between two counter-connected diodes 14 and 15, the anode connections of which are connected to the anode 1 and the cathode 2 of the semi-conductor body respectively. The rectifier bridge is fed from the secondary winding 17 of a transformer 16, whose primary winding 18 is connected between the anode 1 and cathode 2 of the semi-conductor body. The turns ratio of the transformer is chosen so that a suitable bias voltage is produced. By means of the diodes 14 and 15 it is achieved that the minus pole of the bias source is always connected to the most positive of the anode 1 and the cathode 2, which according to the foregoing was the intention.

In FIG. 7 is shown another method of obtaining a suitable bias for the contact 6. This embodiment is shown as applied to a number of series connected semi-conductors of which only two are shown in the figure, but can also be used in conjunction with a single semi-conductor body. The two semi-conductor bodies 7 and 27 shown schematically have the anodes 1 and 21 respectively and the cathodes 2 and 22 respectively and the contacts 6 and 26 respectively connected to the bias voltage source. A voltage divider consisting of a number of impedances, of which the impedances 31–38 are shown, has equally spaced points connected to the connection points between each pair of semi-conductors. The contact 6 is connected to points on the voltage divider through the opposed diodes 28 and 29, which points are placed on a higher or lower potential than the anode 1 or the cathode 2 respectively. The contact 26 is in an analogous way connected to the voltage divider through the diodes 30 and 31. By suitably chosing the impedances of the voltage divider, the contacts 6 and 26 respectively receive a suitable positive bias in relation to the most positive of the anode and the cathode of the corresponding semi-conductor body.

The invention described above makes it possible for the maximum permissible blocking voltage to be considerably increased in relation to previously known devices. Without impairing the other electrical characteristics of the semi-conductor, at least a three-fold increase of the maximum permissible blocking voltage can be obtained.

What is claimed is:

1. A controllable semi-conductor device having two connections for the load current and comprising a body of semi-conducting material, said body comprising three junctions between alternately p-conducting and n-conducting layers, two of said layers, base layers, being adjacent to each other and having a comparatively low conductivity, a first of said base layers having a control electrode for supplying control current to that layer, a second base layer having at least one bias electrode means electrically connected therewith, and means to impose on said bias electrode means a voltage having such a magnitude and polarity that both junctions adjacent to said second base layer are reverse biased, when the semi-conductor device is non-conducting, said bias electrode means comprising a single bias electrode, the area of contact of said electrode with said layer being always, regardless of the polarity of the voltage between the connections for the load current, outside the depletion layers formed at the junctions adjacent to said base layer when the device is non-conducting.

2. A semi-conductor device as claimed in claim 1, the area of contact of said bias electrode means with said second base layer having the form of a circular band on the periphery of said layer.

3. A semi-conductor device as claimed in claim 1, the layers on one side of said second base layer having holes through which the bias electrode means is brought into contact with said second base layer.

References Cited

UNITED STATES PATENTS

| | | | |
|---|---|---|---|
| 2,846,340 | 8/1958 | Jenny | 148—1.5 |
| 2,879,190 | 3/1959 | Logan et al. | 148—1.5 |
| 3,307,049 | 2/1967 | Von Bernuth et al. | 307—88.5 |

JOHN W. HUCKERT, *Primary Examiner.*

J. SHEWMAKER, *Assistant Examiner.*